(12) United States Patent
Aude

(10) Patent No.: US 7,161,430 B1
(45) Date of Patent: Jan. 9, 2007

(54) LOW VOLTAGE FOLDED METAL OXIDE SEMICONDUCTOR FIELD EFFECT TRANSISTOR (MOSFET) AMPLIFIER CIRCUIT

(75) Inventor: Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 72 days.

(21) Appl. No.: 10/957,953

(22) Filed: Oct. 4, 2004

(51) Int. Cl.
*H03F 3/45* (2006.01)

(52) U.S. Cl. ...................................... 330/253; 330/261
(58) Field of Classification Search ................ 330/253, 330/261
See application file for complete search history.

(56) References Cited

U.S. PATENT DOCUMENTS

| | | | |
|---|---|---|---|
| 4,583,037 A | | 4/1986 | Sooch |
| 4,893,090 A | * | 1/1990 | Boudewijns ................ 330/253 |
| 5,729,178 A | * | 3/1998 | Park et al. ................... 330/258 |
| 5,783,956 A | * | 7/1998 | Ooishi ......................... 327/157 |
| 5,825,236 A | * | 10/1998 | Seevinck et al. ............ 327/538 |
| 6,590,456 B1 | * | 7/2003 | Yang ........................... 330/311 |
| 6,781,463 B1 | * | 8/2004 | Burt ............................ 330/255 |

OTHER PUBLICATIONS

U.S. Appl. No. 10/957,976, filed Oct. 4, 2004.

* cited by examiner

*Primary Examiner*—Patricia Nguyen
(74) *Attorney, Agent, or Firm*—Vedder, Price, Kaufman & Kammholz, P.C.

(57) ABSTRACT

A low voltage folded metal oxide semiconductor field effect transistor (MOSFET) amplifier circuit for use in a ring oscillator. Operation at a reduced minimum power supply voltage is achieved via a circuit topology with selectively coordinated transistor biasing and channel dimensions.

18 Claims, 2 Drawing Sheets

US 7,161,430 B1

LOW VOLTAGE FOLDED METAL OXIDE SEMICONDUCTOR FIELD EFFECT TRANSISTOR (MOSFET) AMPLIFIER CIRCUIT

BACKGROUND OF THE INVENTION

1. Field of the Invention

The present invention relates to low voltage metal oxide semiconductor field effect transistor (MOSFET) amplifier circuits, and in particular, to low voltage folded MOSFET amplifier circuits for use in ring oscillators.

2. Description of the Related Art

Referring to FIG. 1, ring oscillators are well known in the art and are used in many applications. In this particular example 10, three stages A1, A2, A3 of fully differential amplifiers 12 are serially coupled in a loop in a negative feedback configuration. During normal operation, this ring will bias the differential nodes, i.e., the positive Vip and negative Vin input signal nodes and positive Vop and negative Von output signal nodes, to the metastable point at which all node voltages are mutually equal.

Referring to FIG. 2, a conventional embodiment 12 of the fully differential amplifier circuits 12 used in such a ring oscillator 10 includes P-type MOSFETs P1$a$, P1$b$ and N-type MOSFETs N1$a$, N1$b$ interconnected substantially as shown between a tail current source 22 and the lower power supply rail VSS/GND. The tail current source 22, in turn, is coupled between the higher power supply rail VDD and the source electrodes of transistors P1$a$ and P1$b$. This tail current source 22 provides a tail current I1 which is a product of two, a reference current Iref and the sum of unity and a common mode factor $\Delta$, i.e., I1=2*Iref*(1+$\Delta$). Lower current sources 24$a$, 24$b$ each sink a current I2 equal to the reference current Iref, while the N-type MOSFETs N1$a$, N1$b$, connected as diodes with their drain and gate electrodes mutually connected, each sink a common mode current I3, which is used to maintain proper biasing of the circuit and is equal to the reference current Iref multiplied by the factor $\Delta$, i.e., I3=$\Delta$*Iref.

As is well known in the art, a typical MOSFET threshold voltage VT is 0.4 volt, while a typical output operating voltage, often referred to as the drain-to-source saturation voltage VDSAT, is 0.2 volt. Accordingly, such a conventional amplifier circuit 12 requires a power supply voltage VDD−VSS equal to 2*VT+3*VDSAT, which is equal to 1.4 volt. While such a minimum power supply voltage requirement is relatively low, as transistor dimensions continue to decrease in an effort to reduce overall integrated circuit sizes and increase circuit densities, power supply voltage decrease as well, thereby making a 1.4 volt minimum power supply voltage begin to look relatively high. Accordingly, it would be desirable to have an amplifier circuit for use in a ring oscillator which is capable of operating at a lower minimum power supply voltage.

SUMMARY OF THE INVENTION

In accordance with the presently claimed invention, a low voltage folded metal oxide semiconductor field effect transistor (MOSFET) amplifier circuit for use in a ring oscillator is provided. Operation at a reduced minimum power supply voltage is achieved via a circuit topology with selectively coordinated transistor biasing and channel dimensions.

In accordance with one embodiment of the presently claimed invention, a low voltage folded MOSFET amplifier circuit includes power supply electrodes and amplifier circuitry. First and second power supply electrodes are to convey a power supply voltage with a minimum magnitude approximately equal to a sum of a transistor threshold voltage and four transistor output saturation voltages. Input amplifier circuitry is coupled between the first and second power supply electrodes and responsive to the minimum power supply voltage magnitude and an input signal by providing an intermediate signal. Output amplifier circuitry is coupled to the input amplifier circuitry and between the first and second power supply electrodes, and responsive to the minimum power supply voltage magnitude, a bias voltage, the input signal and the intermediate signal by providing an output signal.

In accordance with another embodiment of the presently claimed invention, a low voltage folded MOSFET amplifier circuit includes: power supply means for providing a power supply voltage with a minimum magnitude approximately equal to a sum of a transistor threshold voltage and four transistor output saturation voltages; input amplifier means for receiving the minimum power supply voltage magnitude and an input signal and in response thereto generating an intermediate signal; and output amplifier means for receiving the minimum power supply voltage magnitude, a bias voltage, the input signal and the intermediate signal and in response thereto generating an output signal.

In accordance with still another embodiment of the presently claimed invention, a low voltage folded MOSFET amplifier circuit includes power supply electrodes, current source circuitry and amplifier circuitry. First and second power supply electrodes are to convey a power supply voltage. First current source circuitry is coupled to the first power supply electrode and responsive to the power supply voltage by conveying a first current. Second current source circuitry is coupled to the second power supply electrode and responsive to the power supply voltage by conveying a second current. Input amplifier circuitry is coupled to the first current source circuitry and the second current source circuitry, and responsive to at least a portion of at least one of the first and second currents, and an input signal by providing an intermediate signal. Output amplifier circuitry is coupled to the first power supply electrode, the second current source circuitry and the input amplifier circuitry, and responsive to the power supply voltage, a bias voltage, at least a portion of the second current, the input signal and the intermediate signal by providing an output signal.

In accordance with yet another embodiment of the presently claimed invention, a low voltage folded MOSFET amplifier circuit includes: first current source means for receiving a power supply voltage and in response thereto generating a first current; second current source means for receiving the power supply voltage and in response thereto generating a second current; input amplifier means for receiving at least a portion of at least one of the first and second currents, and an input signal, and in response thereto generating an intermediate signal; and output amplifier means for receiving the power supply voltage, a bias voltage, at least a portion of the second current, the input signal and the intermediate signal and in response thereto generating an output signal.

In accordance with still yet another embodiment of the presently claimed invention, a low voltage ring oscillator includes power supply electrodes and a plurality of folded MOSFET amplifier circuits. First and second power supply electrodes are to convey a power supply voltage with a minimum magnitude approximately equal to a sum of a transistor threshold voltage and four transistor output saturation voltages. The folded MOSFET amplifier circuits are serially coupled in a loop and coupled between the first and second power supply electrodes, wherein each one of the plurality of folded MOSFET amplifier circuits includes oscillator amplifier circuitry responsive to the minimum power supply voltage magnitude and a respective input signal by providing a respective output signal.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

In conformance with the discussion herein, it will be appreciated and understood by one of ordinary skill in the art that a MOSFET amplifier circuit in accordance with the presently claimed invention can be implemented with P-MOSFET circuitry as discussed herein, or alternatively, with N-MOSFET circuitry with appropriate reversals in drain and source terminal connections and power supply voltage polarity as appropriate in accordance with well known conventional circuit design techniques.

Figure 1:
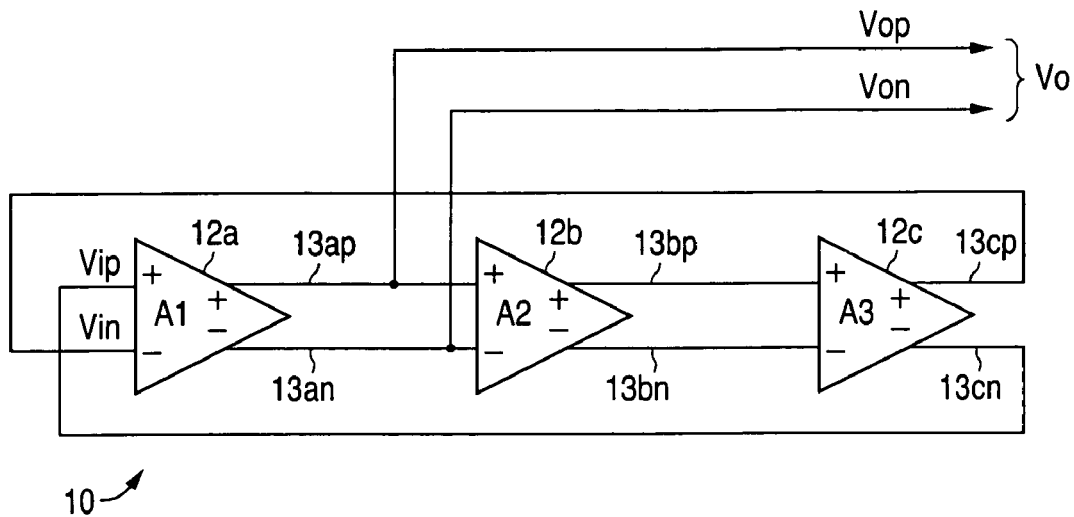
FIG. 1 is a functional block diagram of a conventional 3-stage ring oscillator circuit.
Figure 2:
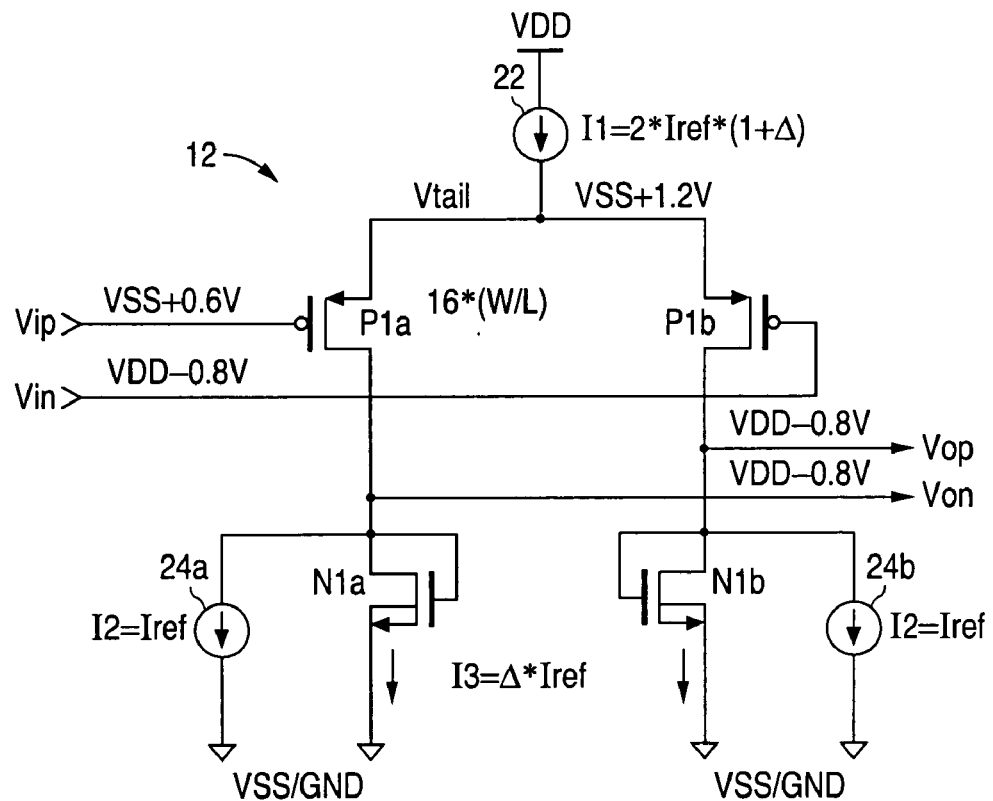
FIG. 2 is a schematic diagram of a conventional fully differential amplifier circuit for use in a ring oscillator.
Figure 3:
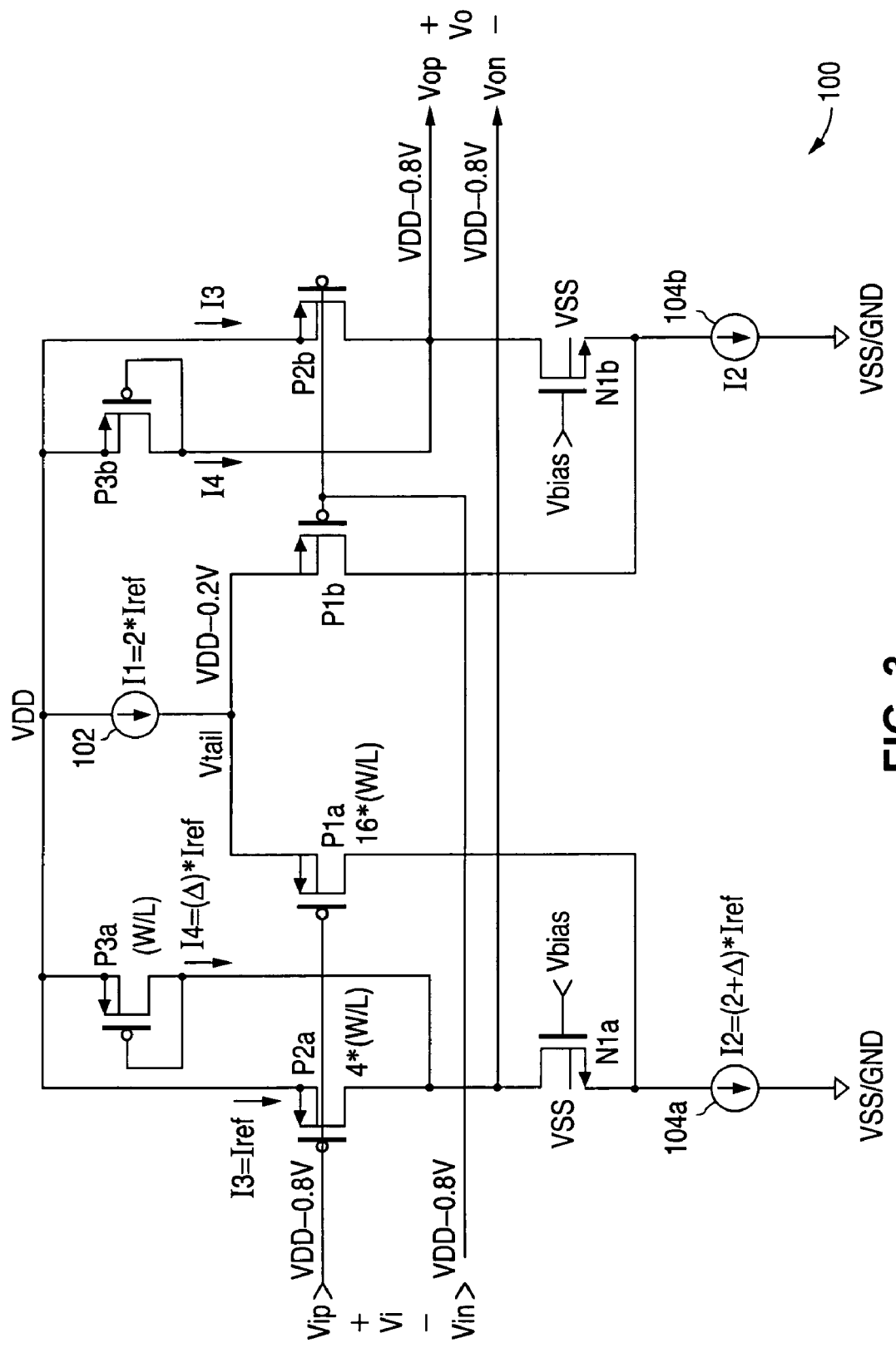
FIG. 3 is a schematic diagram of a low voltage folded MOSFET amplifier circuit in accordance with one embodiment of the presently claimed invention.

Referring to FIG. 3, a low voltage folded MOSFET amplifier circuit in accordance one embodiment 100 of the presently claimed invention includes P-type MOSFETs P1a, P1b, P2a, P2b, P3a, P3b, N-type MOSFETS N1a, N1b and current source circuits 102, 104a, 104b, all interconnected substantially as shown. (The current source circuits 102, 104a, 104b are depicted using generic schematic symbols and, as well understood by one of ordinary skill in the art, can be implemented in accordance with well known current source circuit designs.) This circuit 100 can be described as having an input amplifier circuit formed primarily by transistors P1a and P1b, and an output amplifier circuit formed primarily by transistors P2a, P2b, N1a and N1b, both of which are driven or biased by current sources 102, 104a and 104b and diode-connected transistors P3a and P3b. Input transistors P1a and P1b have channel widths W' and lengths L' such that their width-to-length ratio is equal to 16 times that of a selected normalized ratio W/L, i.e., 16*W/L. A tail current I1 equal to two times a reference current Iref, i.e., I1=2*Iref, is provided by current source 102.

Cascode output transistors N1a and N1b have their gate electrodes biased by an external bias voltage Vbias. Output pull-up transistors P2a and P2b, with their gate electrodes driven by the input signal phases Vip, Vin, conduct a current I3 equal to the reference current Iref and have channel dimensions such that their width-to-length ratios are equal to four times the normalized ratio W/L, i.e., 4*W/L. Additional biasing is provided by transistors P3a and P3b whose channel dimensions caused them to have the normalized width-to-length ratio W/L, and which conduct a bias current I4 equal to the reference current Iref multiplied by the factor Δ, i.e., I4=Δ*Iref. Current sources 104a and 104b each conduct a current I2 equal to the reference current Iref multiplied by the sum of 2 and the factor Δ, i.e., I2=Iref*(2+Δ). The common mode factor Δ is selected, e.g., Δ=0.25, so as to maintain a common mode current for the amplifier circuit 100.

Operation and considerations for design of this amplifier circuit 100 can be described as follows. A primary requirement is to have the tail current source 102 operate in saturation. It is expected that the input transistors P1a, P1b will operate with a saturation voltage VDSAT of 0.2 volt, the tail current source 102 will need 0.15 volt to stay in saturation, and the threshold voltage VT for the transistors is 0.4 volt. Symmetric rise and fall times for the input and output signals Vi, Vo will be achieved if the pull-up current and pull-down currents are equal. However, such equality of such currents cannot always be achieved, thereby requiring some additional current for common mode biasing, as discussed above. Accordingly, the pull-up current (=I1+I3+I4) is designed to be equal to the ideal pull-down current plus the common mode current (=2*I2).

As noted above, current I3 equals the reference current Iref, and the common mode current I4 through the diode-connected transistors P3a, P3b is equal to Δ*Iref. For the example of Δ=0.25, this means that transistors P2a and P2b must have channel dimensions such that their width-to-length ratios are four times larger (i.e., 1/Δ) than those of transistors P3a and P3b. With the tail current I1 equal to 2*Iref, the current through each of transistors P1a and P1b is equal to Iref. Accordingly, if the ratio of the width-to-length ratio of transistors P1a and P1b to the width-to-length ratio of transistors P2a and P2b is set at 4:1, it can be shown (as discussed in more detail below) that the difference in the gate-to-source voltages VGS of these transistors will be equal to 0.2 volt. As a result, the voltage Vtail at the mutually-connected source electrodes of transistors P1a and P1b is equal to VDD-0.2 volt, thereby providing 0.05 volt of headroom for the tail current source 102. As the oscillator output signals Vop, Von vary differentially, they operate in opposition to keep this voltage Vtail constant.

As a result, this amplifier circuit 100 requires a power supply voltage VDD-VSS having a minimum voltage of only VT+4*VDSAT. This minimum power supply voltage value can be found by summing the voltages between power supply rails VDD and VSS through transistors P3a and N1a and current source 104a as follows. The voltage across current source 104a equals one saturation voltage VDSAT, as does the voltage across transistor N1a. For diode-connected transistor P3a, its gate-to-source voltage VGS (which is also equal to its drain-to-source voltage VDS) is equal to the sum of one threshold voltage VT and two saturation voltages VDSAT, i.e., VGS=VT+2VDSAT. Hence, the minimum power supply voltage, which is the sum of these voltages, is VDD−VSS=VDSAT+VDSAT+VT+2*VDSAT=VT+4VDSAT.

As noted above, in accordance with a well-known circuit design technique (e.g., see U.S. Pat. No. 4,583,037, the disclosure of which is incorporated herein by reference), transistor dimensions can be scaled in proportion to one another to control and maintain their respective inter-electrode voltages. This can be demonstrated in accordance with well-known MOSFET circuit operating characteristics. As is well-known, drain currents ID1 and ID2 of transistors T1 and T2, respectively, can be computed based upon the majority carrier mobility u, the gate capacitance per unit area Cox, the channel width W, channel length L, threshold voltage VT, transistor scaling factor N and the respective gate-to-source voltages VGS1 (transistor T1), VGS2 (transistor T2), as follows:

$$\text{Equation 1: } id_1 = \frac{u \cdot Cox}{2} \cdot \frac{N \cdot W}{L}(VGS_1 - VT)^2$$

$$\text{Equation 2: } id_2 = \frac{u \cdot Cox}{2} \cdot \frac{W}{L}(VGS_2 - VT)^2$$

Setting these currents equal to each other ($id_1 = id_2$) produces Equation 3, which can be simplified and reduced as follows, for scaling factors of N=4 and N=9:

$$\text{Equation 3: } \frac{u \cdot Cox}{2} \cdot \frac{N \cdot W}{L}(VGS_1 - VT)^2 = \frac{u \cdot Cox}{2} \cdot \frac{W}{L}(VGS_2 - VT)^2$$

$N(VGS_1-VT)^2=(VGS_2-VT)^2$      Equation 4

$\sqrt{N}(VGS_1-VT)=(VGS_2-VT)$      Equation 5

$VGS_2=\sqrt{N}(VGS_1-VT)+VT$      Equation 6

$VGS_2-VGS_1=\sqrt{N}(VGS_1-VT)+VT-VGS_1$      Equation 7

$VGS_2-VGS_1=\sqrt{N}(VGS_1-VT)-(VGS_1-VT)$      Equation 8

$VGS_2-VGS_1=(\sqrt{N}-1)(VGS_1-VT)$      Equation 9

Example: $N=4$, $VGS_2-VGS_1=(VGS_1-VT)=VDSAT_1$      Equation 10

Example: $N=9$, $VGS_2-VGS_1=2(VGS_1-VT)=2VDSAT_1$      Equation 11

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a low voltage folded metal oxide semiconductor field effect transistor (MOSFET) amplifier circuit, comprising:

first and second power supply electrodes to convey a power supply voltage with a minimum magnitude approximately equal to a sum of a transistor threshold voltage and four transistor output saturation voltages;

input amplifier circuitry coupled between said first and second power supply electrodes and responsive to said minimum power supply voltage magnitude and an input signal by providing an intermediate signal; and output amplifier circuitry coupled to said input amplifier circuitry and between said first and second power supply electrodes, and responsive to said minimum power supply voltage magnitude, a bias voltage, said input signal and said intermediate signal by providing an output signal.

2. The apparatus of claim 1, wherein said input amplifier circuitry comprises:

current source circuitry coupled to said first power supply electrode and responsive to said minimum power supply voltage magnitude by conveying a current; and differential amplifier circuitry coupled to said current source circuitry and responsive to said current and a differential input signal as said input signal by providing a differential intermediate signal as said intermediate signal.

3. The apparatus of claim 1, wherein said input amplifier circuitry comprises:

first current source circuitry coupled to said first power supply electrode and responsive to said minimum power supply voltage magnitude by conveying a first current;

second current source circuitry coupled to said second power supply electrode and responsive to said minimum power supply voltage magnitude by conveying a second current; and differential amplifier circuitry coupled between said first current source circuitry and said second current source circuitry, and responsive to at least a portion of at least one of said first and second currents and a differential input signal as said input signal by providing a differential intermediate signal as said intermediate signal.

4. The apparatus of claim 1, wherein said output amplifier circuitry comprises:

current source circuitry coupled to said second power supply electrode and responsive to said minimum power supply voltage magnitude by conveying a current; and differential amplifier circuitry coupled between said first power supply electrode and said current source circuitry, and responsive to said minimum power supply voltage magnitude, said bias voltage, at least a portion of said current, said input signal and said intermediate signal by providing a differential output signal as said output signal.

5. The apparatus of claim 1, wherein said output amplifier circuitry comprises:

first current source circuitry coupled to said first power supply electrode and responsive to said minimum power supply voltage magnitude by conveying a first current;

second current source circuitry coupled to said second power supply electrode and responsive to said minimum power supply voltage magnitude by conveying a second current; and differential amplifier circuitry coupled to said first power supply electrode, said first current source circuitry and said second current source circuitry and responsive to said minimum power supply voltage magnitude, said bias voltage, at least a portion of at least one of said first and second currents, said input signal and said intermediate signal by providing a differential output signal as said output signal.

6. An apparatus including a low voltage folded metal oxide semiconductor field effect transistor (MOSFET) amplifier circuit, comprising:
   power supply means for providing a power supply voltage with a minimum magnitude approximately equal to a sum of a transistor threshold voltage and four transistor output saturation voltages;
   input amplifier means for receiving said minimum power supply voltage magnitude and an input signal and in response thereto generating an intermediate signal; and
   output amplifier means for receiving said minimum power supply voltage magnitude, a bias voltage, said input signal and said intermediate signal and in response thereto generating an output signal.

7. An apparatus including a low voltage folded metal oxide semiconductor field effect transistor (MOSFET) amplifier circuit, comprising:
   first and second power supply electrodes to convey a power supply voltage with a minimum magnitude approximately equal to a sum of a transistor threshold voltage and four transistor output saturation voltages;
   first current source circuitry coupled to said first power supply electrode and responsive to said power supply voltage by conveying a first current;
   second current source circuitry coupled to said second power supply electrode and responsive to said power supply voltage by conveying a second current;
   input amplifier circuitry coupled to said first current source circuitry and said second current source circuitry, and responsive to at least a portion of at least one of said first and second currents, and an input signal by providing an intermediate signal; and
   output amplifier circuitry coupled to said first power supply electrode, said second current source circuitry and said input amplifier circuitry, and responsive to said power supply voltage, a bias voltage, at least a portion of said second current, said input signal and said intermediate signal by providing an output signal.

8. The apparatus of claim 7, wherein said input amplifier circuitry comprises differential amplifier circuitry coupled between said first current source circuitry and said second current source circuitry, and responsive to at least said first current and a differential input signal as said input signal by providing a differential intermediate signal as said intermediate signal.

9. The apparatus of claim 7, wherein said output amplifier circuitry comprises differential amplifier circuitry coupled between said first power supply electrode and said second current source circuitry, and responsive to said power supply voltage, said bias voltage, said at least a portion of said second current, said input signal and said intermediate signal by providing a differential output signal as said output signal.

10. The apparatus of claim 7, wherein said output amplifier circuitry comprises:
   third current source circuitry coupled to said first power supply electrode and responsive to said power supply voltage by conveying another portion of said second current; and
   differential amplifier circuitry coupled to said first power supply electrode, said second current source circuitry and said third current source circuitry, and responsive to said power supply voltage, said bias voltage, said at least a portion of said second current, said another portion of said second current, said input signal and said intermediate signal by providing a differential output signal as said output signal.

11. The apparatus of claim 7, further comprising third current source circuitry coupled to said first power supply electrode and responsive to said power supply voltage by conveying another portion of said second current.

12. An apparatus including a low voltage folded metal oxide semiconductor field effect transistor (MOSFET) amplifier circuit, comprising:
   first current source means for receiving a power supply voltage with a minimum magnitude approximately equal to a sum of a transistor threshold voltage and four transistor output saturation voltages, and in response thereto generating a first current;
   second current source means for receiving said power supply voltage and in response thereto generating a second current;
   input amplifier means for receiving at least a portion of at least one of said first and second currents, and an input signal, and in response thereto generating an intermediate signal; and
   output amplifier means for receiving said power supply voltage, a bias voltage, at least a portion of said second current, said input signal and said intermediate signal and in response thereto generating an output signal.

13. An apparatus including a low voltage ring oscillator, comprising:
   first and second power supply electrodes to convey a power supply voltage with a minimum magnitude approximately equal to a sum of a transistor threshold voltage and four transistor output saturation voltages; and
   a plurality of folded metal oxide semiconductor field effect transistor (MOSFET) amplifier circuits serially coupled in a loop and coupled between said first and second power supply electrodes, wherein each one of said plurality of folded MOSFET amplifier circuits includes oscillator amplifier circuitry responsive to said minimum power supply voltage magnitude and a respective input signal by providing a respective output signal.

14. The apparatus of claim 13, wherein:
   said oscillator amplifier circuitry comprises first and second differential input signal electrodes and first and second differential output signal electrodes which, responsive to said minimum power supply voltage magnitude and said respective input signal, have first, second, third and fourth DC voltages, respectively; and
   said first, second, third and fourth DC voltages are substantially mutually equal.

15. The apparatus of claim 13, wherein said oscillator amplifier circuitry comprises:
   input amplifier circuitry coupled between said first and second power supply electrodes and responsive to said minimum power supply voltage magnitude and an input signal by providing an intermediate signal; and
   output amplifier circuitry coupled to said input amplifier circuitry and between said first and second power supply electrodes, and responsive to said minimum power supply voltage magnitude, a bias voltage, said input signal and said intermediate signal by providing an output signal.

16. The apparatus of claim 15, wherein:
   said input amplifier circuitry comprises first and second differential signal electrodes which, responsive to said minimum power supply voltage magnitude and said respective input signal, have first and second DC voltages, respectively;

said output amplifier circuitry comprises third and fourth differential signal electrodes which, responsive to said minimum power supply voltage magnitude, have third and fourth DC voltages, respectively; and said first, second, third and fourth DC voltages are substantially mutually equal.

17. The apparatus of claim 13, wherein said oscillator amplifier circuitry comprises:

first current source circuitry coupled to said first power supply electrode and responsive to said power supply voltage by conveying a first current;

second current source circuitry coupled to said second power supply electrode and responsive to said power supply voltage by conveying a second current;

input amplifier circuitry coupled to said first current source circuitry and said second current source circuitry, and responsive to at least a portion of at least one of said first and second currents, and an input signal by providing an intermediate signal; and output amplifier circuitry coupled to said first power supply electrode, said second current source circuitry and said input amplifier circuitry, and responsive to said power supply voltage, a bias voltage, at least a portion of said second current, said input signal and said intermediate signal by providing an output signal.

18. The apparatus of claim 17, wherein:

said input amplifier circuitry comprises first and second differential signal electrodes which, responsive to said minimum power supply voltage magnitude and said respective input signal, have first and second DC voltages, respectively;

said output amplifier circuitry comprises third and fourth differential signal electrodes which, responsive to said minimum power supply voltage magnitude, have third and fourth DC voltages, respectively; and said first, second, third and fourth DC voltages are substantially mutually equal.

\* \* \* \* \*

UNITED STATES PATENT AND TRADEMARK OFFICE
CERTIFICATE OF CORRECTION

| | | |
|---|---|---|
| PATENT NO. | : 7,161,430 B1 | Page 1 of 1 |
| APPLICATION NO. | : 10/957953 | |
| DATED | : January 9, 2007 | |
| INVENTOR(S) | : Arlo Aude | |

It is certified that error appears in the above-identified patent and that said Letters Patent is hereby corrected as shown below:

Column 3, line 53, please delete "in accordance one" and insert --in accordance with one--;
Column 3, line 64, please delete "Nla" and insert --N1a--; and
Column 5, line 53, please delete "alternations" and insert --alterations--.

Signed and Sealed this

Sixth Day of March, 2007

JON W. DUDAS
*Director of the United States Patent and Trademark Office*